United States Patent
Kolar et al.

(10) Patent No.: US 6,302,707 B1
(45) Date of Patent: Oct. 16, 2001

(54) ELECTRIC CIRCUIT PROVIDED WITH A PLUG-IN CONNECTOR, IN PARTICULAR A CONTROL DEVICE FOR MOTOR VEHICLES

(75) Inventors: Robert Kolar, Ihrlerstein; Thomas Lehnst, Braunschweig; Heinrich Probst, Tegernheim; Josef Dirmeyer, Bodenwöhr, all of (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/688,924

(22) Filed: Oct. 16, 2000

Related U.S. Application Data

(63) Continuation of application No. PCT/EP99/02477, filed on Apr. 7, 1999.

(30) Foreign Application Priority Data

Apr. 16, 1998 (DE) .............................................. 198 16 904

(51) Int. Cl.[7] .................................................. H01R 12/00
(52) U.S. Cl. ......................................... 439/76.1; 439/188
(58) Field of Search ................................... 439/76.1, 188, 439/607, 74, 79, 68, 70, 489, 80, 609; 361/87, 45, 115, 399, 752; 174/51, 52.1, 261, 267; 200/51.5

(56) References Cited

U.S. PATENT DOCUMENTS

| | | |
|---|---|---|
| 4,115,665 | 9/1978 | Giacoppo et al. . |
| 4,993,956 * | 2/1991 | Pickles et al. ........................ 439/76.1 |
| 5,040,994 * | 8/1991 | Nakamoto et al. ................. 439/76.1 |
| 5,283,712 * | 2/1994 | Michihira et al. ................... 439/785 |
| 5,286,920 * | 2/1994 | Fassel et al. ......................... 439/76.7 |
| 5,353,185 * | 10/1994 | Bodkin .................................... 361/49 |
| 5,890,917 * | 4/1999 | Ishida et al. .......................... 439/101 |
| 5,934,913 * | 10/1999 | Kodama ............................... 439/76.1 |
| 6,002,563 * | 12/1999 | Esakoff et al. ......................... 361/87 |
| 6,086,411 * | 7/2000 | Shinozaki ............................. 439/489 |

FOREIGN PATENT DOCUMENTS

| | | |
|---|---|---|
| 39 02 230 A1 | 8/1990 | (DE) . |
| 39 09 912 A1 | 9/1990 | (DE) . |
| 91 09 488.7 | 10/1991 | (DE) . |
| 41 13 710 C1 | 8/1992 | (DE) . |
| 91 12 178.7 | 8/1992 | (DE) . |
| 41 40 692 A1 | 6/1993 | (DE) . |
| 44 36 547 A1 | 4/1996 | (DE) . |

* cited by examiner

*Primary Examiner*—Brian Sircus
*Assistant Examiner*—J. F. Duverne
(74) *Attorney, Agent, or Firm*—Herbert L. Lerner; Laurence A. Greenberg; Werner H. Stemer

(57) ABSTRACT

An electric circuit configuration includes an electric circuit, with a printed circuit board provided in a housing. The printed circuit board carries circuit elements and defines a printed circuit board plane. A plug-in connector element is provided at the housing and has a plurality of contact elements disposed in at least one first row. The plug-in connector element has short-circuit interrupters disposed at respective interrupter positions at the rear wall The short-circuit interrupters are configured as electrically non-conductive pins integrally formed with the rear wall and are disposed in a second row. None of the contact elements are, none of the contact elements are disposed in the second row. The second row is disposed beneath the at least one first row and is closer to the printed circuit board plane than the at least one first row. Thus the number of plug contact elements can be increased considerably without increasing the overall height of the control device.

12 Claims, 4 Drawing Sheets

ELECTRIC CIRCUIT PROVIDED WITH A PLUG-IN CONNECTOR, IN PARTICULAR A CONTROL DEVICE FOR MOTOR VEHICLES

CROSS-REFERENCE TO RELATED APPLICATION:

This application is a continuation of copending International Application No. PCT/EP99/02477, filed Apr. 7, 1999, which designated the United States.

BACKGROUND OF THE INVENTION

1. Field of the Invention

The invention relates to an electric circuit provided with a housing. An externally accessible plug-in connector element is fitted to the electric circuit. More specifically, the invention relates to a control device for motor vehicles, in particular a control device for an occupant protection system of a motor vehicle.

Published Non-Prosecuted German Patent Application DE 44 36 547 A1 discloses a circuit with a housing. A plug-in connector element is provided on a housing side wall. The plug-in connector has a plug-in chamber in which there is a plurality of contact pins disposed in different vertical positions. At their rear side, these contact pins are connected to corresponding connections on the internal printed circuit board.

German Utility Model DE 91 09 488 U1 describes an electric plug-in connector in whose housing there are two parallel rows of contact chambers located next to one another. Provided in one row of contact chambers are contact elements, while short-circuit interrupter elements are provided in the other row of contact chambers.

With the prior art devices, if the number of contact pins is increased, the overall size of the device must be increased, which disadvantageously requires additional mounting space.

SUMMARY OF THE INVENTION

It is accordingly an object of the invention to provide an electric circuit configuration which overcomes the above-mentioned disadvantages of the heretofore-known configurations of this general type which has a housing, a large number of contact elements and short-circuit interrupters and which has a low overall height and which can be easily mounted.

With the foregoing and other objects in view there is provided, in accordance with the invention, an electric circuit configuration, including:

a housing;

an electric circuit, preferably a motor vehicle control device, including a printed circuit board provided in the housing;

the printed circuit board carrying circuit elements and defining a printed circuit board plane;

a plug-in connector element provided at the housing and having a plurality of contact elements disposed in at least one first row;

the plug-in connector element having a wall bounding a plug-in chamber open to an exterior, the wall including a rear wall, and the wall extending downward, below the printed circuit board plane;

the plug-in connector element having short-circuit interrupters disposed at respective interrupter positions at the rear wall;

the short-circuit interrupters being configured as electrically non-conductive pins integrally formed with the rear wall, or alternatively, the short-circuit interrupters being configured as at least one continuous web formed from material of the wall, the at least one continuous web covering at least two of the respective interrupter positions at the rear wall;

the short-circuit interrupters being disposed in a second row, none of the contact elements being disposed in the second row; and the second row being disposed beneath the at least one first row and being closer to the printed circuit board plane than the at least one first row.

In the circuit according to the invention, the plug-in connector element has been enlarged, and thus also makes use of that installation space which is available at the side underneath the level of the printed circuit board. This provides an enlarged plug-in chamber, which can accommodate an increased number of contact elements and/or short-circuit interrupters, without the total overall height of the housing, and hence of the circuit (for example the control device), being enlarged. It is therefore possible for the external dimensions of the circuit to be maintained in spite of the increase in the contact options, so that no enlarged mounting space has to be provided.

In the plug-in connector element, that row which is located closest to the printed circuit board (on, above or beneath the printed circuit board plane) is fully occupied by short-circuit interrupters, so that no contact elements are provided in this row. This simplifies the wiring to the printed circuit board, since the contact elements to be wired are located considerably above the printed circuit board plane and can be connected to the printed circuit board by curved connecting wires. By contrast, the short-circuit interrupters do not need any kind of wiring, so that their close physical proximity to the printed circuit board plane does not cause any wiring problems. In spite of the provision of an additional row of pins (short-circuit interrupters) in the plug, the wiring problems are consequently not increased, in particular with regard to routing the connecting wires in different vertical positions.

There are preferably three parallel rows in the plug, all the short-circuit interrupters being provided in the lowest row, located closest to the printed circuit board, and the two other parallel rows being fully occupied by contact elements (contact pins or contact sockets), so that a wiring with a high density and a large number of contacts in a small space results.

The contact elements can be connected to the printed circuit board connections by flexible conductors, but are preferably connected to the printed circuit board by stiff connecting wires, in particular bent wires. By soldering the connecting wires to the printed circuit board, the plug-in connector element is not only connected electrically but at the same time also supported mechanically.

The short-circuit interrupters are formed by electrically non-conductive pins or webs formed of plug-in connection wall material. If a number or all of the short-circuit interrupters are formed by a web, which can be inserted into a corresponding receiving opening in the mating plug, it is possible there for a plurality of short-circuit links to be opened at the same time. In the case of this embodiment, the short-circuit interrupters are distinguished by high mechanical strength and are thus well protected against damage, undesired deformation or the like.

Other features which are considered as characteristic for the invention are set forth in the appended claims.

Although the invention is illustrated and described herein as embodied in an electric circuit provided with a plug-in connector, in particular a control device for motor vehicles, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
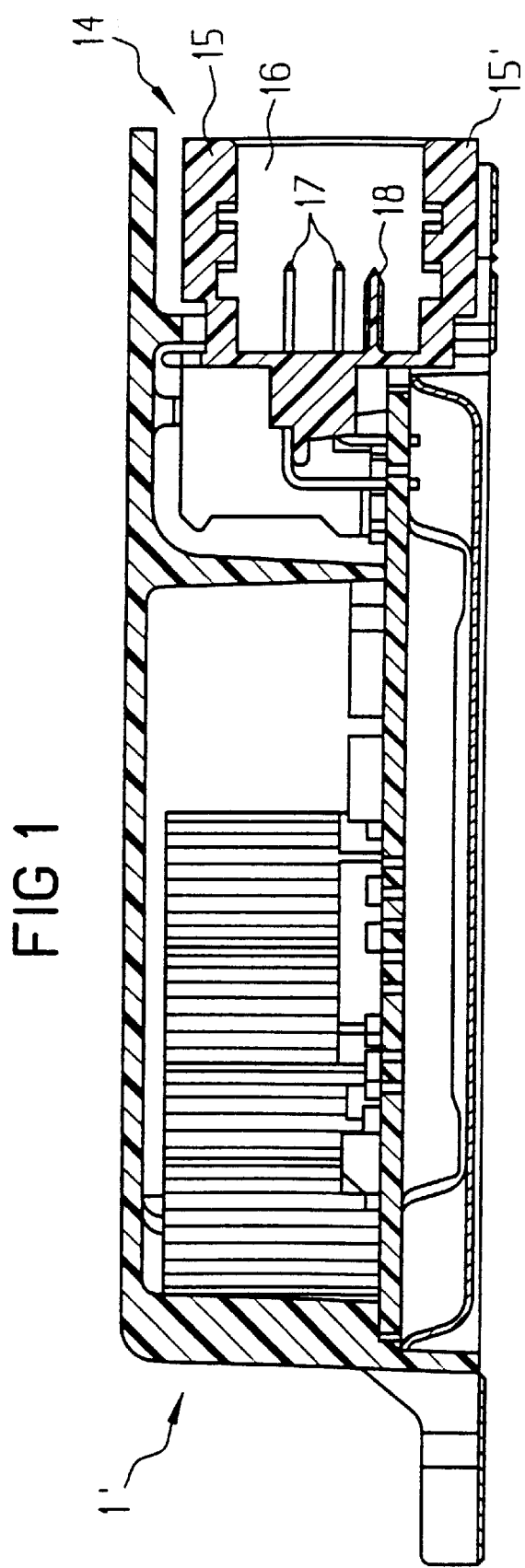
FIG. 1 is a cross sectional view of an exemplary embodiment of the electric circuit configuration according to the invention.
Figure 2:
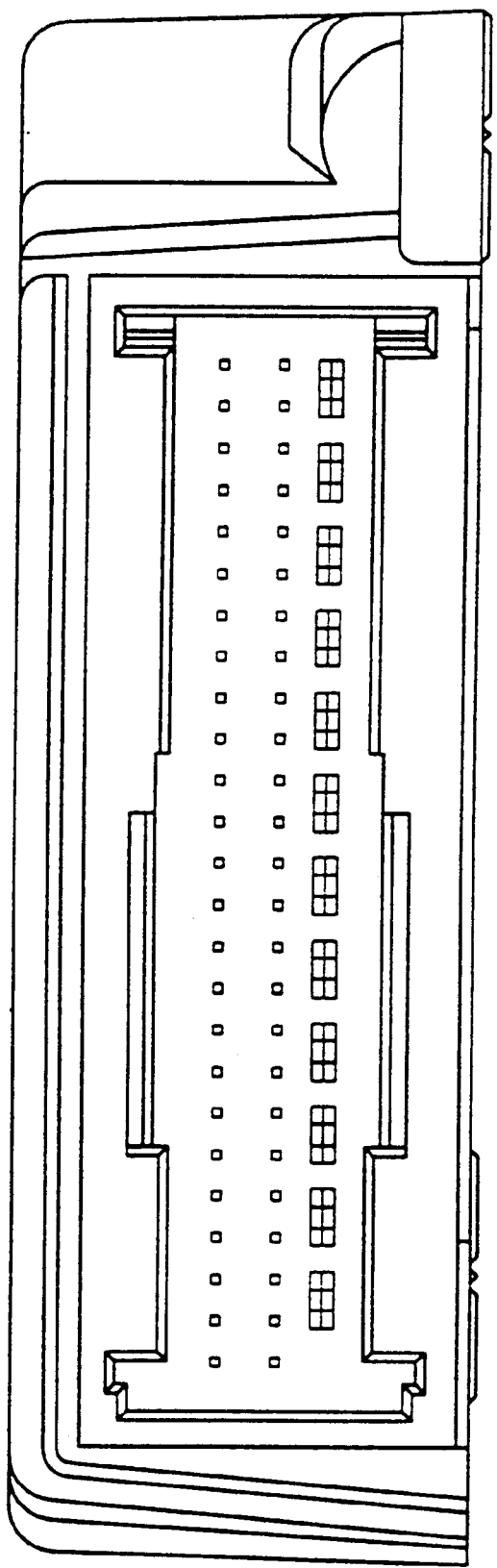
FIG. 2 is a side plan view of the electric circuit configuration of FIG. 1.
Figure 3:
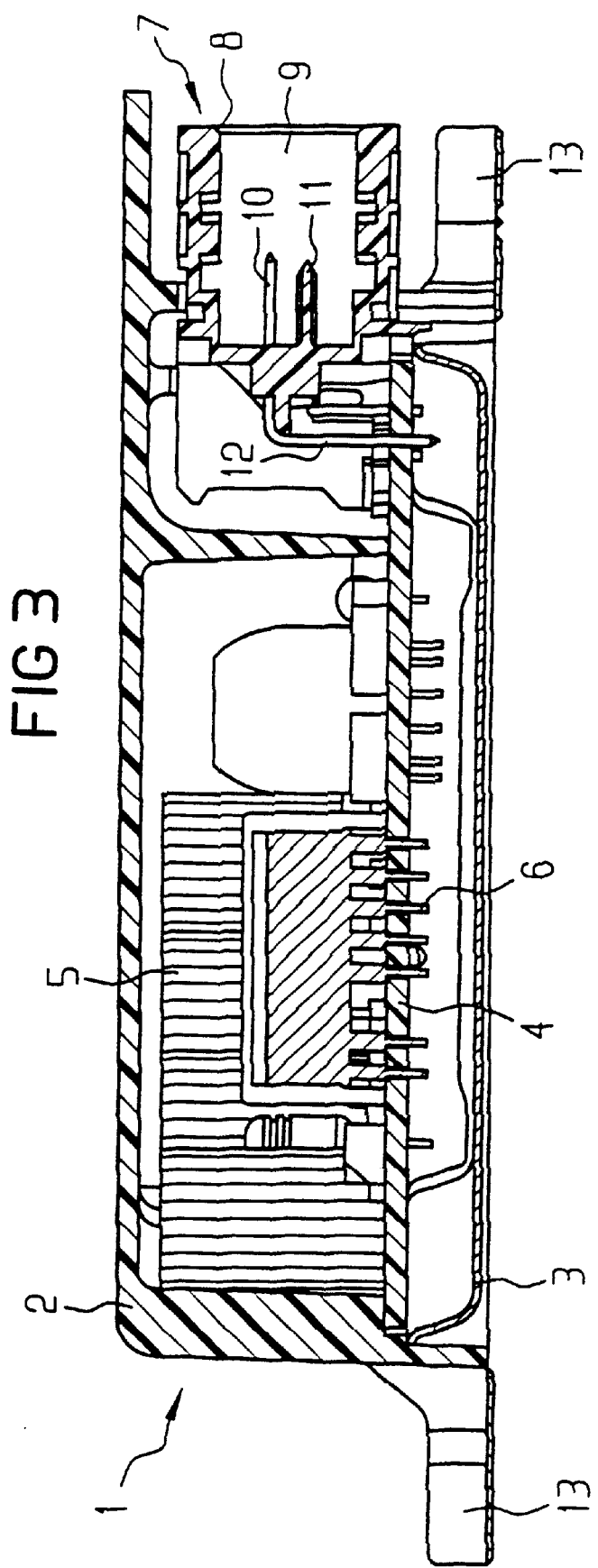
FIG. 3 is a cross sectional view of an exemplary embodiment of an electric circuit configuration.
Figure 4:
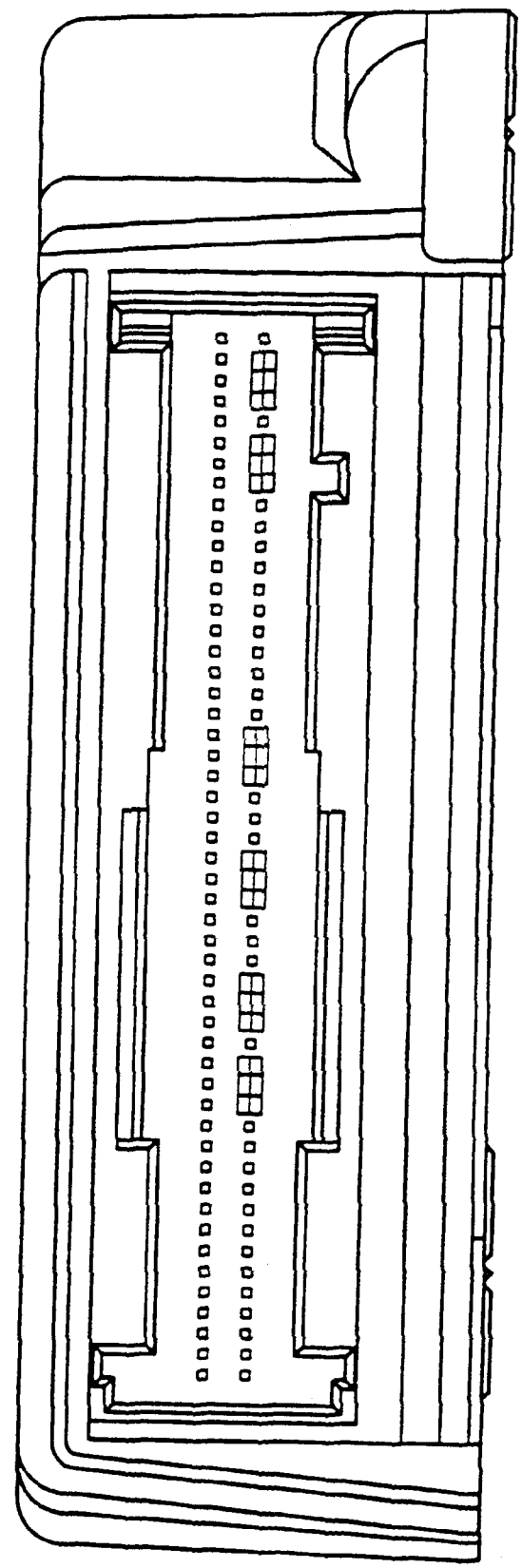
FIG. 4 is a side plan view of the electric circuit configuration of FIG. 4.

In order to better explain the embodiments according to the invention as shown in FIGS. 1 and 2, reference is firstly made to FIGS. 3 and 4, which show embodiments, which are based on preliminary considerations of the inventors. FIGS. 3 and 4 show an electric circuit in the form of a control device 1 for a motor vehicle airbag system. FIG. 3 shows a cross section through the control device 1, which has a housing 2 with a cover 3. The housing 2 and the cover 3 form an internal space which is enclosed on all sides and in which there is provided a printed circuit board 4 on whose upper side components 5 are positioned. The components 5 are provided with contact pins 6, which are led through corresponding openings in the printed circuit board 4 and with which contact is made through the use of conductor tracks which are present on the underside of the printed circuit board. However, the components 5 can also be configured, partially or as a whole, as surface-mountable components, which are wired only on the upper side of the printed circuit board. Alternatively, components can also be provided on the underside of the printed circuit board. As FIG. 3 shows, the printed circuit board 4 rests on appropriate bearing shoulders and supporting projections of the housing 2 and is fixed in the position shown in FIG. 3 through the use of the cover 3 or other devices. The downwardly curved cover 3 provides a corresponding cavity underneath the printed circuit board 4 to accommodate components which may be located on the soldering side (underside) of the printed circuit board, and to form corresponding safety margins from these components and the contact pins 6—led through the printed circuit board—of the components 5 provided on the upper side of the printed circuit board.

As FIG. 3 shows, provided on one side wall of the control device 1 is a plug-in connector element 7 in the form of a plug, which has a peripheral wall 8 and a plug-in chamber 9, formed within the wall 8, to accommodate an appropriately configured mating plug. The plug-in connector element 7 is fixed on one side by engaging teeth between projections and depressions formed on the housing 2, and on the other side by correspondingly shaped depressions and projections formed on the plug-in connector element 7, as can be seen from FIG. 3. This way, the plug-in connector element 7 is prevented from sliding sideways or moving axially as the mating plug is plugged in/withdrawn. The mating plug (not illustrated) is preferably connected via a flexible line to the associated components to be controlled by the control device 1, for example the firing pellets of the airbag system.

Provided on the rear wall of the plug-in connector element 7, facing the plug-in chamber 9, are a number of contact elements 10 in the form of contact pins (or sockets), which on the rear of the plug, that is to say within the housing 2, are connected to corresponding connections on the printed circuit board 4 through the use of bent, dimensionally stable connecting wires 12 in the form of metallic conductor wires or conductor webs. The connecting wires 12 are led through corresponding openings in the printed circuit board 4 and can thus have contact made with them electrically, for example can be soldered, on the underside of the printed circuit board, that is to say on the soldering side.

Also provided in the plug-in chamber 9 are short-circuit interrupters 11, which run parallel to the contact pins 10 but are formed in one piece with the rear plug wall and, if necessary, are provided with additional plastic caps pushed on. The interrupter pins (short-circuit interrupters) 11 are electrically non-conductive and are not wired to the printed circuit board 4 either. The short-circuit interrupters 11 are used to disconnect sprung short-circuit links which are present in the mating plug, in that they are inserted between the two respective spring contacts of the mating plug, which are normally in contact with each other and therefore produce a short circuit, and by this configuration break the short circuit on the respective short-circuit links. These short-circuit links are provided in order to avoid malfunctioning of the device to be connected to the control device 1 when it is being handled, that is to say in the state in which it is not yet connected to the control device 1. The device can contain, for example, one or more firing pellets of an occupant protection system, in particular of an airbag system. The short-circuit links ensure that a short circuit is present in parallel with the firing pellets or other circuit components to be protected, so that voltages or currents which are caused by inadvertent contact with potential-carrying components or as a result of interfering electromagnetic waves or radiation cannot act on the firing pellets. This protective state is not cancelled by the short-circuit interrupters 11 until the mating plug is inserted into the plug-in connector element 7, so that the firing pellets (or other circuit components to be controlled) can subsequently be controlled by the control device 1 in a manner matched to the situation.

In order to fix the control device 1 at a given installation position, bearing flanges 13 are provided on the underside of the housing 2, and can be screwed to the control-device supporting surface by screws.

As can be seen from FIG. 3, the planes of the contact pins 10 and of the interrupter pins 11 are located above the upper side of the printed circuit board, so that the contact pins 10 can be connected in a simple way to the printed circuit board connections through the use of the bent connecting wires 12 led downward. Overall, the entire plug-in chamber 9 and the wall 8 are located above the level of the printed circuit board.

FIG. 4 illustrates a side view of the control device 1 shown in FIG. 3, which according to FIG. 3 is viewed from the right and therefore permits a view into the plug-in chamber 9. As FIG. 4 shows, all the contact pins 10 are provided in two parallel rows, the short-circuit interrupters 11 being provided in the same (lower) row as the plug pins 10 and alternating with the latter. The short-circuit interrupters 11 occupy two or three contact-pin grid spaces, so that the number of contact pins which is available is reduced by the short-circuit interrupters. The plug-in connector element 7 illustrated is a 50-pole, two-row plug, but in the case of the plug, with the use of, for example, eight short-circuit interrupters 11, each occupying two contact-pin grid spaces, only a maximum of 34 contact pins can be allocated.

If an attempt is made to increase the number of contact pins in the device of FIGS. 3 and 4, the overall size of the control device 1 must be increased, which disadvantageously requires additional mounting space. The invention overcomes this disadvantage with a device as shown in FIGS. 1 and 2.

The invention is described in the following with reference to FIGS. 1 and 2. FIG. 1 is a cross sectional view of an exemplary embodiment of the electric circuit according to the invention in the form of a control device 1' of a motor vehicle occupant protection system, in particular an airbag system, while a side view viewed from the right (according to FIG. 1) is shown in FIG. 2. The control device 1' has essentially the same construction as the control device 1 illustrated in FIG. 3, with the exception of the lateral plug-in connector element. The identical components are provided with the same reference symbols and will not be explained again.

As can be seen from FIGS. 1 and 2, the plug-in chamber 16—surrounded by a wall 15—of the plug-in connector element (plug) 14 is configured to be larger than that in FIGS. 3 and 4, the lower wall section 15' of the wall 15, adjacent to the cover 3, being located beneath the printed circuit board plane. Provided in this enlarged plug-in chamber 16 are two parallel rows of contact elements 17, which here have the form of contact pins, but can also be configured as contact sockets. The contact pins project at right angles from the rear wall of the plug-in chamber 16. In the exemplary embodiment shown, 50 contact pins (two rows of 25 contact elements) are provided, so that a large number of signals can be transmitted. The number of contact pins can be increased or reduced, depending on the intended use, so that the number of rows of contact elements can be modified correspondingly as well.

Provided in parallel with the rows of contact elements in the plug-in chamber 16 is a row of short-circuit interrupters, which project at right angles from the rear wall and are formed in one piece with the latter, that is to say are formed by the insulating wall material. The short-circuit interrupters 18 can also contain plastic caps pushed onto these projecting sections, and effect the disconnection of the short-circuit links provided at appropriate positions in the mating plug (not illustrated). The short-circuit interrupters 18 are positioned in the lowest row, that is to say the row located closest to the printed circuit board plane. Since the short-circuit interrupters 18 do not require any kind of electrical wiring to the printed circuit board 4, in spite of this close proximity to the printed circuit board no conductor routing problems result. The wiring of the contact elements 17 to the printed circuit board 4 can therefore be carried out, in spite of the presence of a third functional row in the plug, in the same way as in FIGS. 3 and 4 with the aid of connecting wires 12 which are provided in only two layers, run from both rows of contact elements. The connecting wires initially run at a height corresponding to the vertical position of the contact elements, and are subsequently routed downward at right angles to the printed circuit board along two parallel planes.

In the exemplary embodiment shown in FIGS. 1 and 2, all the short-circuit interrupters are provided in the lowest row. If, however, additional short-circuit interrupters should be required, these can also be positioned in the central or upper row of contact elements. Conversely, however, providing contact elements in the lowest row of short-circuit interrupters should be avoided, since the contact elements would have to be connected separately to the printed circuit board via individual connecting lines.

As can be seen from FIG. 1, the row of short-circuit interrupters is provided in a plane which is located slightly above the plane of the upper side of the printed circuit board. However, the short-circuit interrupters can also be provided in the same vertical position as the printed circuit board or even beneath this level. Moreover, the individual short-circuit interrupters 18 shown in FIG. 2 can also be formed by a single continuous strip of electrically insulating material, for example the plug wall material. In this case, the strip can also be subdivided into a number of separate part-strips, so that not all but in each case only some short-circuit interrupters are formed by strip sections.

As a result of displacing the short-circuit interrupters (plastic tongues) 18 into the lowest row of contacts, and enlarging the plug-in chamber 16 at the bottom, the overall housing space located beneath the printed circuit board can be utilized for the plug-in connector function. The total overall height can consequently be kept very compact.

The mating plug-in connector element to be connected to the plug-in connector element 14 contains the contact elements and short-circuit interrupters in a positioning and grouping matched to the plug-in connector element 14.

As can be seen in particular from FIG. 2, the lower wall section of the plug wall 15, running parallel to the bottom surface, is provided at the side, beside the bearing flange 13, essentially in the vertical position of the latter, and has only a small spacing from the mounting supporting surface. The considerable enlargement of the plug-in chamber 16 in the circuit according to the invention can clearly be seen, in particular from a direct comparison of FIGS. 2 and 4.

The printed circuit board 4 can also be provided in the housing 2 in the reversed position, so that the components 5 point downward. In this case, the bearing surfaces provided on the housing 2 for the printed circuit board 4 are provided with a smaller spacing from the parallel housing wall, and the cover 3 is enlarged in such a way that it can cover the components 5. In this case, the plug-in connector element 14 is likewise provided with a reversed positioning, so that the short-circuit interrupters 18 are then provided in the uppermost row, that is to say again closer to the printed circuit board plane than the rows of contact elements.

We claim:

1. An electric circuit configuration, comprising:

a housing;

an electric circuit including a printed circuit board provided in said housing;

said printed circuit board carrying circuit elements and defining a printed circuit board plane;

a plug-in connector element provided at said housing and having a plurality of contact elements disposed in at least one first row;

said plug-in connector element having a wall bounding a plug-in chamber open to an exterior, said wall including a rear wall, and said wall extending downward, below the printed circuit board plane;

said plug-in connector element having short-circuit interrupters disposed at respective interrupter positions at said rear wall;

said short-circuit interrupters being configured as electrically non-conductive pins integrally formed with said rear wall, and said short-circuit interrupters being disposed in a second row, none of said contact elements being disposed in said second row; and said second row being disposed beneath said at least one first row and being closer to the printed circuit board plane than said at least one first row.

2. The electric circuit configuration according to claim 1, wherein said contact elements are connected to said printed circuit board.

3. The electric circuit configuration according to claim 1, including connecting lines for connecting said contact elements to said printed circuit board.

4. The electric circuit configuration according to claim 1, including bent connecting lines for connecting said contact elements to said printed circuit board.

5. The electric circuit configuration according to claim 1, including dimensionally stable conductors for connecting said contact elements to said printed circuit board.

6. The electric circuit configuration according to claim 1, wherein said electric circuit is a motor vehicle control device.

7. An electric circuit configuration, comprising:

a housing;

an electric circuit including a printed circuit board provided in said housing;

said printed circuit board carrying circuit elements and defining a printed circuit board plane;

a plug-in connector element provided at said housing and having a plurality of contact elements disposed in at least one first row;

said plug-in connector element having a wall bounding a plug-in chamber open to an exterior, said wall including a rear wall, and said wall extending downward, below the printed circuit board plane;

said plug-in connector element having short-circuit interrupters disposed at respective interrupter positions at said rear wall;

said short-circuit interrupters being configured as at least one continuous web formed from material of said wall, said at least one continuous web covering at least two of the respective interrupter positions at said rear wall, and said short-circuit interrupters being disposed in a second row, none of said contact elements being disposed in said second row; and said second row being disposed beneath said at least one first row and being closer to the printed circuit board plane than said at least one first row.

8. The electric circuit configuration according to claim 7, wherein said contact elements are connected to said printed circuit board.

9. The electric circuit configuration according to claim 7, including connecting lines for connecting said contact elements to said printed circuit board.

10. The electric circuit configuration according to claim 7, including bent connecting lines for connecting said contact elements to said printed circuit board.

11. The electric circuit configuration according to claim 7, including dimensionally stable conductors for connecting said contact elements to said printed circuit board.

12. The electric circuit configuration according to claim 7, wherein said electric circuit is a motor vehicle control device.

\* \* \* \* \*